United States Patent
Hsu et al.

(10) Patent No.: US 8,513,128 B2
(45) Date of Patent: Aug. 20, 2013

(54) POLY OPENING POLISH PROCESS

(75) Inventors: Chun-Wei Hsu, Taipei (TW); Po-Cheng Huang, Chiayi (TW); Teng-Chun Tsai, Tainan (TW); Chia-Lin Hsu, Tainan (TW); Chih-Hsun Lin, Pingtung County (TW); Chang-Hung Kung, Kaohsiung (TW); Chia-His Chen, Kaohsiung (TW); Yen-Ming Chen, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 161 days.

(21) Appl. No.: 13/162,776

(22) Filed: Jun. 17, 2011

(65) Prior Publication Data
US 2012/0322265 A1 Dec. 20, 2012

(51) Int. Cl.
*H01L 21/304* (2006.01)
*H01L 21/306* (2006.01)
*B44C 1/22* (2006.01)

(52) U.S. Cl.
USPC ............. 438/693; 438/692; 216/88; 216/89

(58) Field of Classification Search
CPC ........................................................ C09G 1/02
USPC .......................... 438/692, 693; 216/88, 89
See application file for complete search history.

(56) References Cited

U.S. PATENT DOCUMENTS

| 5,896,870 | A | 4/1999 | Huynh et al. | |
| 6,171,436 | B1 | 1/2001 | Huynh et al. | |
| 6,905,890 | B2* | 6/2005 | Chen et al. | 438/7 |
| 7,399,437 | B2 | 7/2008 | James et al. | |
| 7,687,393 | B2 | 3/2010 | Iwasa | |
| 2005/0170980 | A1* | 8/2005 | Lu et al. | 510/175 |
| 2009/0011599 | A1* | 1/2009 | Lee et al. | 438/693 |
| 2010/0048007 | A1* | 2/2010 | Lee et al. | 438/585 |
| 2010/0112798 | A1* | 5/2010 | Lai et al. | 438/591 |
| 2011/0108894 | A1* | 5/2011 | Sung et al. | 257/288 |
| 2012/0288995 | A1* | 11/2012 | El-Ghoroury et al. | 438/107 |

* cited by examiner

*Primary Examiner* — Shamim Ahmed
(74) *Attorney, Agent, or Firm* — WPAT, PC; Justin King

(57) ABSTRACT

A poly opening polish process includes the following steps. A semi-finished semiconductor component is provided. The semi-finished semiconductor component includes a substrate, a gate disposed on the substrate, and a dielectric layer disposed on the substrate and covering the gate. A first polishing process is applied onto the dielectric layer. A second polishing process is applied to the gate. The second polishing process utilizes a wetting solution including a water soluble polymer surfactant, an alkaline compound and water. The poly opening polish process can effectively remove an oxide residue formed in the chemical mechanical polish, thereby improving the performance of the integrated circuit and reducing the production cost of the integrated circuit.

16 Claims, 3 Drawing Sheets

---

Providing a semi-finished semiconductor component including a substrate, a gate on the substrate and a dielectric layer covering the gate

↓

Applying a first polishing process onto the dielectric layer

↓

Applying a second polishing process to the gate by using a wetting solution including a water soluble polymer surfactant, an alkaline compound and water

POLY OPENING POLISH PROCESS

FIELD OF THE INVENTION

The present invention relates to a fabrication of a semiconductor component, and particularly to a poly opening polish process applied to a fabrication of a metal-oxide-semiconductor (MOS) transistor.

BACKGROUND OF THE INVENTION

In the technology for manufacturing an integrated circuit, for example, a MOS transistor, a gate structure including an insulating layer with high dielectric constant (high-K) and a metal gate (hereafter called HK/MG for short) has been widely developed and used. Currently, the HK/MG can be fabricated by either a gate-last process or a gate-first process. For example, in the gate-last process, a chemical mechanical polish (CMP) is generally applied onto an interlevel dielectric (ILD) layer covering the poly-silicon dummy gate so as to expose the poly-silicon dummy gate, which is also called as a poly opening polish process. After the poly opening polish process, the poly-silicon dummy gate is removed and the metal gate of the HK/MG is filled to replace the poly-silicon dummy gate.

However, typically, in the poly opening polish process, an abrasive (e.g., a colloid silica) of a polishing slurry in the chemical mechanical polish is prone to form an oxide residue (e.g., a silicon oxide) deposited on the exposed poly-silicon dummy gate. Furthermore, the oxide residue can not be effectively removed in the subsequent steps of the typical poly opening polish process such as a water cleaning step and a post cleaning step. The oxide residue deposited on the exposed poly-silicon dummy gate will affect removing the poly-silicon dummy gate and the deposition of the metal gate, thereby affecting the performance of the integrated circuit. On the other hand, the deposited oxide residue will decrease the life time of a polishing pad, thereby increasing the production cost of the integrated circuit.

Therefore, what is needed is a poly opening polish process to overcome the above disadvantages.

SUMMARY OF THE INVENTION

The present invention provides a poly opening polish process so as to effectively remove an oxide residue formed in a previous chemical mechanical polish, thereby improving the performance of a MOS transistor and reducing the production cost of the MOS transistor.

To achieve the above-mentioned advantages, the present invention provides a poly opening polish process including the following steps. A semi-finished semiconductor component is provided. The semi-finished semiconductor component includes a substrate, a gate disposed on the substrate, and a dielectric layer disposed on the substrate and covering the gate. A first polishing process is applied onto the dielectric layer. A second polishing process is applied to the gate. The second polishing process utilizes a wetting solution including a water soluble polymer surfactant, an alkaline compound and water.

In one embodiment of the present invention, the gate is a poly silicon gate.

In one embodiment of the present invention, the first polishing process is a chemical mechanical polishing process.

In one embodiment of the present invention, the dielectric layer includes a first dielectric layer and a second dielectric layer. The first dielectric layer is disposed on the substrate and covers the poly silicon gate, and the second dielectric layer is disposed on the first dielectric layer. The step of applying the first polishing process onto the dielectric layer includes the following steps. At first, a first chemical mechanical polishing process is applied onto the second dielectric layer by using a first polishing slurry so as to expose the first dielectric layer.

In one embodiment of the present invention, the poly opening polish process further includes applying a dry etching process onto the first dielectric layer after the first chemical mechanical polishing process so as to expose the gate.

In one embodiment of the present invention, the poly opening polish process further includes a second chemical mechanical polishing process applied onto the first dielectric layer by using a second polishing slurry after the first chemical mechanical polishing process.

In one embodiment of the present invention, the semi-finished semiconductor component includes a hard mark between the gate and the dielectric layer, the hard mark is exposed after the second chemical mechanical polishing process, and the poly opening polish process further includes applying a dry etching process onto the hard mark after the second chemical mechanical polishing process.

In one embodiment of the present invention, the first dielectric layer is a contact etch stop layer including silicon nitride, and the second dielectric layer is an interlayer dielectric layer including silicon oxide.

In one embodiment of the present invention, the first polishing slurry includes cerium oxide, and the second polishing slurry includes colloid silica.

In one embodiment of the present invention, the first polishing slurry and the second polishing slurry are acidic, and the wetting solution is alkaline.

In one embodiment of the present invention, the first polishing slurry has a pH substantially ranging from 5 to 6, the second polishing slurry has a pH substantially ranging from 4 to 5, and the wetting solution has a pH about 10.

In one embodiment of the present invention, a concentration of the water soluble polymer surfactant is less than 1 wt %.

In one embodiment of the present invention, the water soluble polymer surfactant is selected from a group consisting of hydroxy ethyl cellulose, hydroxy propyl celluslose, polyvinly alcohol, polyvinyl pyrrolidone, and pullulan, and the alkaline compound is either ammonia or quaternary ammonium base.

In one embodiment of the present invention, an operating time of the second polishing process is less than 60 seconds.

In one embodiment of the present invention, a down force ranging from 0.5 to 2 pounds per square inch (psi) is applied to the exposed gate during the second polishing process.

In one embodiment of the present invention, the down force is imposed by a polishing pad operated in a rotation speed ranging from 57 to 63 rotations per minute (rpm).

In one embodiment of the present invention, the poly opening polish process further includes a pad pre-cleaning process by using the wetting solution before the second polishing process.

In one embodiment of the present invention, the poly opening polishing process further includes a post cleaning process after the second polishing process.

In one embodiment of the present invention, the post cleaning process includes a mega cleaning step and a brush cleaning step. The mega cleaning step utilizes a first cleaning solution including $NH_4OH$ and $H_2O_2$. The brush cleaning step utilizes a second cleaning solution including dilute hydrofluoric acid.

In one embodiment of the present invention, the exposed gate forms a hydrophilic surface after the second polishing process.

In the poly opening polish process of the present invention includes a second polishing process applied to the exposed poly silicon gate. The second polishing process utilizes the wetting solution including a water soluble polymer surfactant, an alkaline compound and water so as to effectively remove the oxide residue formed during the previous chemical mechanical polish, thereby improving the performance of the MOS transistor. Furthermore, during the second polishing process, the polishing pad can be renewed by the wetting solution, thereby increasing the life time of the polishing pad and reducing the production cost of the MOS transistor.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
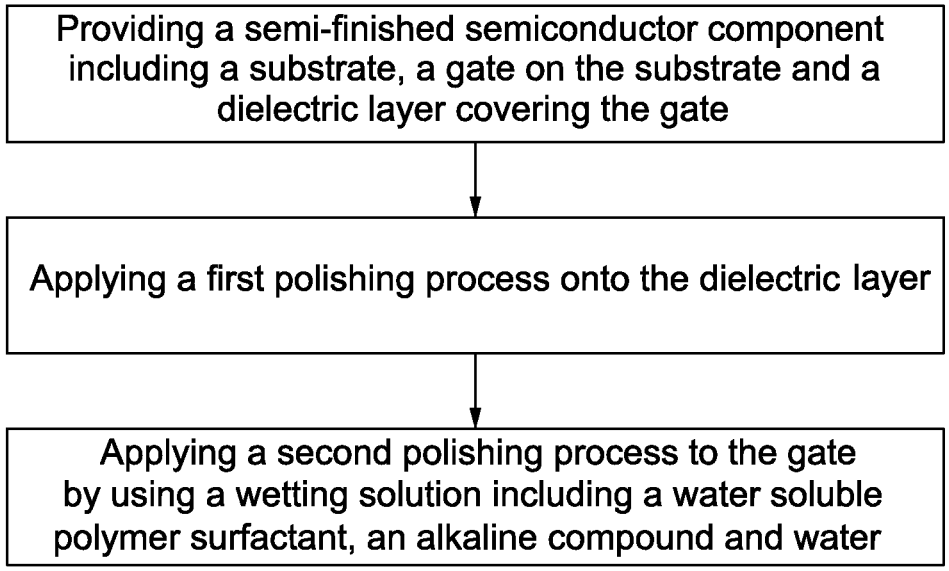
FIG. 1 illustrates a flow chart of a poly opening polish process in accordance with an embodiment of the present invention.

FIG. 1 illustrates a flow chart of a poly opening polish process in accordance with an embodiment of the present invention. Referring to FIG. 1, the poly opening polish process includes the following steps. Firstly, a semi-finished semiconductor component including a substrate, a gate on the substrate and a dielectric layer covering the gate is provided. Secondly, a first polishing process is applied onto the dielectric layer so as to expose the gate. Thirdly, a second polishing process is applied to the exposed poly silicon gate. The second polishing process utilizes a wetting solution comprising a water soluble polymer surfactant, an alkaline compound and water. In the following description, the poly opening polish process will be applied to a gate last process of a metal-oxide-semiconductor (MOS) transistor.

Figure 2A:
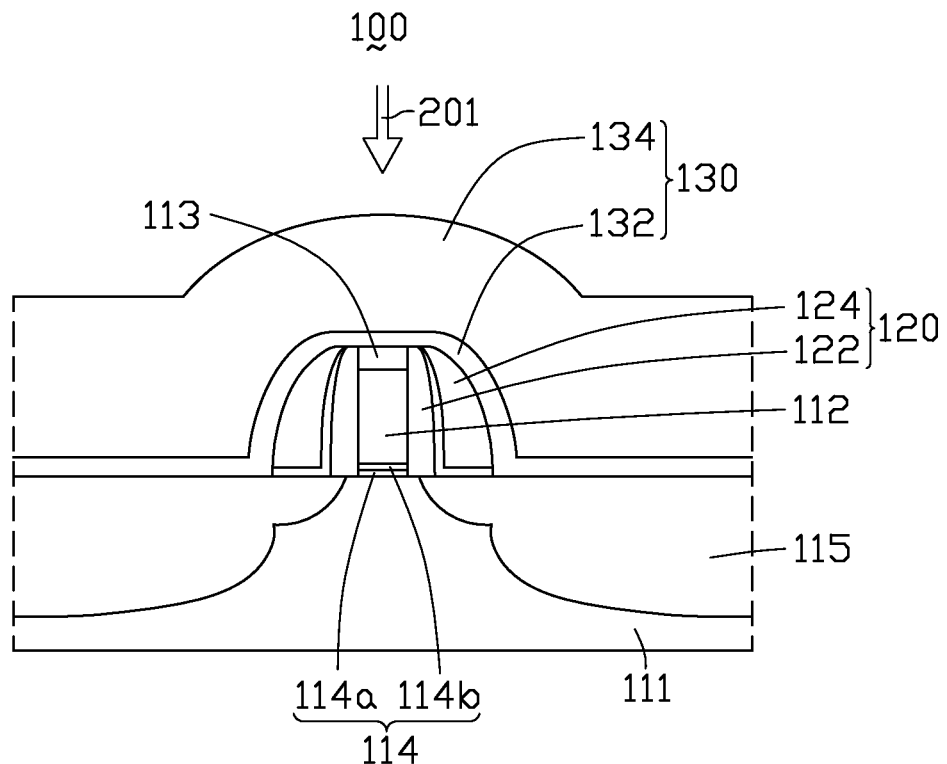
FIGS. 2A-2C illustrate a process flow of a poly opening polish process in accordance with an embodiment of the present invention.

FIGS. 2A-2D illustrate a process flow of a poly opening polish process in accordance with an embodiment of the present invention. Referring to FIG. 2A, a semi-finished semiconductor component 100 is used to fabricate a MOS transistor is provided. The semi-finished semiconductor component 100 includes a substrate 111. A gate 112 is formed on the substrate 111. In the present embodiment, the gate 112 is a poly silicon gate as a dummy gate. The gate 112 is covered by a hard mask 113 and is formed on a gate dielectric layer 114. The gate dielectric layer 114 can be a multiplayer structure as shown in FIG.2A, which includes a silicon oxide layer 114a and a high-K insulating layer 114b. Two source/drain regions 115 are defined in a substrate 111 and located at two sides of the gate 112. The gate 112 and the hard mask 113 are surrounded by a spacer 120. The spacer 120 also can be a multilayer structure as shown in FIG. 2A, which includes a first spacer 122 and a second spacer 124. The first spacer 122 can be either a composite layer structure including a silicon oxide layer and a silicon nitride layer, or a pure silicon oxide layer. The second spacer 124 can be either a composite layer structure including a silicon oxide layer and a silicon nitride layer, or a composite layer structure including a silicon nitride layer, a silicon oxide layer and a silicon nitride layer.

In addition, a dielectric layer 130 is disposed on the substrate 111 and covers the gate 112, the hard mask 113, the two source/drain regions 115 and the spacer 120. In the present embodiment, the dielectric layer 130 includes a first dielectric layer 132 and a second dielectric layer 134. The first dielectric layer 132 is formed on the substrate 112 to cover the hard mask 118, the gate 112, the two source/drain regions 115 and the spacer 120. The second dielectric layer 134 is formed on the first dielectric layer 132. In the present embodiment, the first dielectric layer 132 is, for example, a contact etch stop layer (CESL), and the second dielectric layer 134 is, for example, an interlayer dielectric (ILD) layer. A material of the first dielectric layer 132 includes silicon nitride and can have a function of generating the stress. A material of the second dielectric layer 134 includes silicon oxide.

Figure 2B:
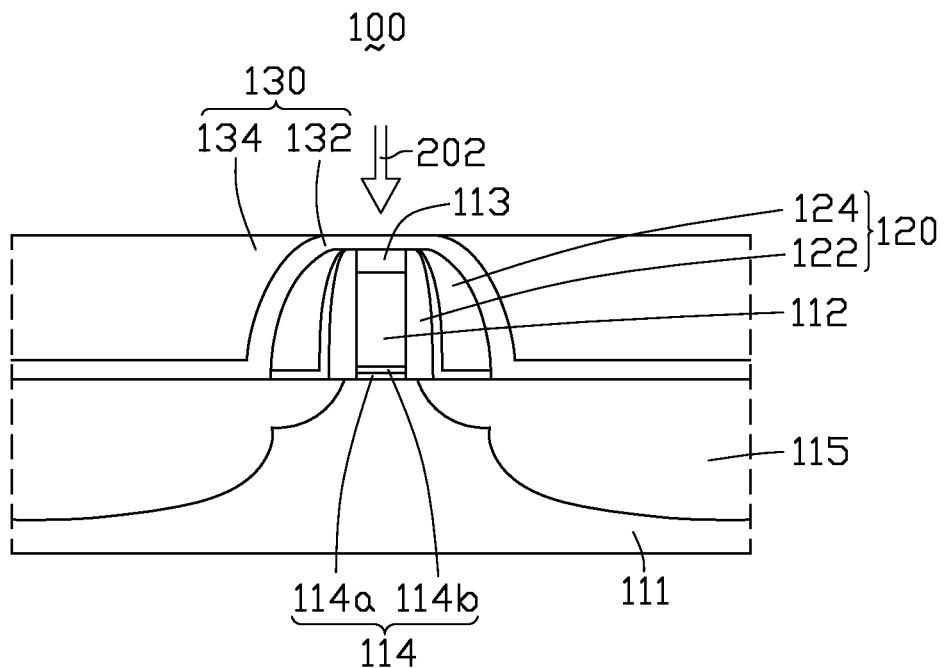
Figure 2C:
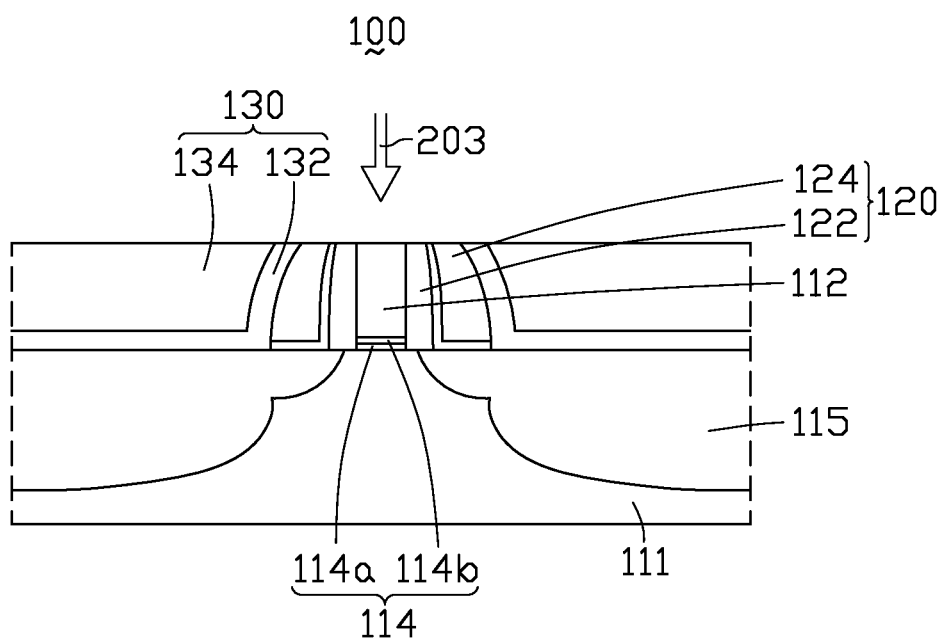

Next, referring to FIG. 2A to FIG. 2C, in the present embodiment, a first polishing process (not labeled), such as a top cut chemical mechanical polishing process is applied onto the dielectric layer 130 to remove the partial structures on the substrate 111 to expose the gate 112.

In detail, in the present embodiment, at first, as shown in FIG. 2A, a first chemical mechanical polishing process 201 is applied onto the second dielectric layer 134 by using a first polishing slurry so as to expose the first dielectric layer 132. After the first chemical mechanical polishing process 201, as shown in FIG. 2B, a part of the second dielectric layer 134 is removed to expose the first dielectric layer 132. The first polishing slurry includes, for example, cerium oxide, surfactant and water. In the present embodiment, the first polishing slurry is acidic and has a pH substantially ranging from 5 to 6.

Thereafter, as shown in FIG. 2B, a second chemical mechanical polishing process 202 is applied onto the first dielectric layer 132 by using a second polishing slurry so as to expose the gate 112. It is noted that, in another embodiment, after the second chemical mechanical polishing process 202, the gate 112 can not be exposed from the dielectric layer 130. In other words, a portion of hard mark 113 (e.g., the portion of hard mark 113 has a thickness of 75 angstroms) is still remained on the gate 112 after the second chemical mechanical polishing process 202. The portion of hard mark 113 can be removed by a dry etching process so as to expose the gate 112. In still another embodiment, after the first chemical mechanical polishing process 201, the first dielectric layer 132 and the hard mask 113 can be removed together by a dry etching process so as to expose the gate 112.

After the second chemical mechanical polishing process 202, as shown in FIG. 2C, a part of the first dielectric layer 132, the hard mask 113, and a top portion of the spacer 120 are removed. As a result, the gate 112 is exposed from the dielectric layer 130. It is noted that, the spacer 120 is also exposed from the polished dielectric layer 130. The second polishing slurry includes, for example, colloid silica, ammonium salt, organic acid, surfactant and water. In the present embodiment, the second polishing slurry is acidic and has a pH substantially ranging from 4 to 5.

During the first polishing process, especially during the second chemical mechanical polishing process 202, the colloid silica of the second polishing slurry used in the second chemical mechanical polishing process 202 is prone to form a silicon oxide residue deposited on the exposed gate 112. Therefore, after the first polishing process, the silicon oxide residue should be effectively removed so as to avoid affecting the performance of the MOS transistor to be fabricated.

Next, referring to FIG. 2C, a second polishing process 203 is applied to the exposed gate 112. For example, the second polishing process 203 is a chemical mechanical polishing process by using a wetting solution. The wetting solution includes, for example, a water soluble polymer surfactant, an alkaline compound and water. The water soluble polymer surfactant can be selected from a group consisting of hydroxy ethyl cellulose, hydroxy propyl celluslose, polyvinly alcohol, polyvinyl pyrrolidone, and pullulan. A concentration of the water soluble polymer surfactant is less than 1 wt %. The alkaline compound can be either ammonia or quaternary ammonium base. The wetting solution is alkaline and has a pH substantially ranging from 7 to 14. Preferably, the wetting solution has a pH about 10.

Additionally, the exposed gate 112 is polished by a polishing pad (not shown) used in the second polishing process 203. The polishing pad can be different from the polishing pads in the first chemical mechanical polishing process 201 and the second chemical mechanical polishing process 202. The polishing pad in the second polishing process 203, for example, can be an extremely soft pad or a buffing pad, and the polishing pads in the first chemical mechanical polishing process 201 and the second chemical mechanical polishing process 202 can be hard pads. In the present embodiment, an operating time of the second polishing process 203 is less than 60 seconds. A down force ranging from 0.5 to 2 pounds per square inch (psi) is applied to the exposed gate 112 during the second polishing process, which is imposed by the polishing pad. The polishing pad is operated in a rotation speed of 57~63 rotations per minute (rpm) during the second polishing process 203. Additionally, a pad pre-cleaning process by using the same wetting solution can be performed before the second polishing process 203. It is noted that, the polishing parameters can be adjusted according to the various components of the wetting solution and the various polishing pads.

It is noted that, in the second polishing process 203, the wetting solution including the water soluble polymer surfactant selected from a group consisting of hydroxy ethyl cellulose, hydroxy propyl celluslose, polyvinly alcohol, polyvinyl pyrrolidone, and pullulan is used. When the wetting solution is applied to the silicon oxide residue, a repulsive force of the silicon oxide residue can be increased due to a negative zeta potential. Thus, the silicon oxide residue deposited on the exposed gate 112 can be removed effectively. Additionally, a contact angel of the exposed gate 112 can be reduced after the second polishing process 203. Thus, the exposed gate 112 can form a hydrophilic surface. Furthermore, the polishing pad used in the second polishing process 203 can be renewed during the second polishing process 203, thereby avoiding a deposition of the silicon oxide residue on the polishing pad and increasing the lift time of the polishing pad. Thus, the production of the MOS transistor can be reduced.

Thereafter, the subsequent steps for fabricating the semiconductor component 100 into the finished MOS transistor are performed. For example, the gate 112 is removed, and a metal gate is filled to replace the gate 112, and so on, which is not described here.

Figure 3:
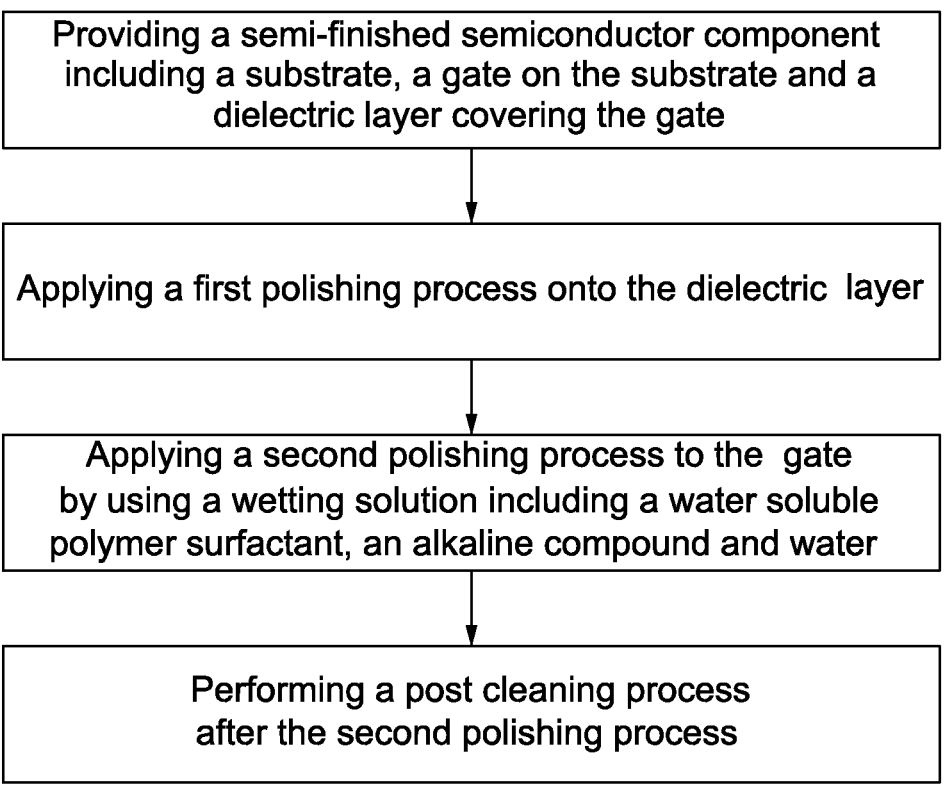
FIG. 3 illustrates a flow chart of a poly opening polish process in accordance with another embodiment of the present invention.

FIG. 3 illustrates a flow chart of a poly opening polish process in accordance with another embodiment of the present invention. Referring to FIG. 3, in the present embodiment, a poly opening polishing process is similar to the poly opening polishing process in aforesaid embodiment. In the present embodiment, the poly opening polishing process further includes a post cleaning process to further clean the semi-finished semiconductor component 100 after the second polishing process 203. During the post cleaning process, the semi-finished semiconductor component 100 after the second polishing process 203 is disposed in a cleaning tank to be cleaned. The post cleaning process includes a mega cleaning step and a brush cleaning step. In the mega cleaning step, a first cleaning solution having $NH_4OH$ and $H_2O_2$ is used. In the brush cleaning step, a second cleaning solution having dilute hydrofluoric acid (DHF) is used. Further, the brush cleaning step further includes a first brush cleaning step and a second brush cleaning step. The first brush cleaning step is performed before the second brush cleaning step, and utilizes a cleaning solution including $NH_4OH$. The second cleaning solution having dilute hydrofluoric acid (DHF) is used in the second brush cleaning step.

In summary, the poly opening polish process of the present invention includes a second polishing process applied to the exposed poly silicon gate. The second polishing process utilizes a wetting solution including a water soluble polymer surfactant, an alkaline compound and water so as to effectively remove an oxide residue formed during the previous chemical mechanical polish, thereby improving the performance of the MOS transistor. Furthermore, during the second polishing process, the polishing pad can be renewed by the wetting solution, thereby increasing the life time of the polishing pad and reducing the production cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A poly opening polish process, comprising:
   providing a semi-finished semiconductor component comprising:
   a substrate;
   a gate disposed on the substrate; and
   a hard mask disposed on the gate; and
   a dielectric layer disposed on the substrate and covering the gate and the hard mask, the dielectric layer comprising a first dielectric layer and a second dielectric layer, the first dielectric layer being disposed on the substrate and covering the gate and the hard mask, the second dielectric layer being disposed on the first dielectric layer; and
   applying a first polishing process onto the dielectric layer, comprising:
   applying a first chemical mechanical polishing process onto the second dielectric layer so as to expose the first dielectric layer;
   applying a second chemical mechanical polishing process onto the first dielectric layer after the first chemical mechanical polishing process so as to expose the hard mask; and
   applying a dry etching process onto the hard mask after the second chemical mechanical polishing process so as to expose the gate.

2. The poly opening polish process as claimed in claim 1, wherein the gate is a poly silicon gate.

3. The poly opening polish process as claimed in claim 1, wherein the first dielectric layer is a contact etch stop layer comprising silicon nitride, and the second dielectric layer is an interlayer dielectric layer comprising silicon oxide.

4. The poly opening polish process as claimed in claim 1, wherein the first chemical mechanical polishing process utilities a first polishing slurry, the second chemical mechanical polishing process utilities a second polishing slurry, the first polishing slurry comprises cerium oxide, and the second polishing slurry comprises colloid silica.

5. The poly opening polish process as claimed in claim 1, wherein the first chemical mechanical polishing process utilities a first polishing slurry, the second chemical mechanical polishing process utilities a second polishing slurry, the first polishing slurry and the second polishing slurry are acidic.

6. The poly opening polish process as claimed in claim 1, wherein the first chemical mechanical polishing process utilities a first polishing slurry, the second chemical mechanical polishing process utilities a second polishing slurry, the first polishing slurry has a pH substantially ranging from 5 to 6, the second polishing slurry has a pH substantially ranging from 4 to 5.

7. The poly opening polish process as claimed in claim 1, wherein an operating time of the second polishing process is less than 60 seconds.

8. The poly opening polish process as claimed in claim 1, wherein a down force ranging from 0.5 to 2 pounds per square inch is applied to the exposed gate during the second polishing process.

9. The poly opening polish process as claimed in claim 8, wherein the down force is imposed by a polishing pad operated in a rotation speed ranging from 57 to 63 rotations per minute.

10. The poly opening polish process as claimed in claim 9, further comprising a pad pre-cleaning process by using the wetting solution before the second polishing process.

11. The poly opening polish process as claimed in claim 1, further comprising a post cleaning process after the second polishing process.

12. The poly opening polish process as claimed in claim 11, wherein the post cleaning process comprises:
a mega cleaning step utilizing a first cleaning solution comprising $NH_4OH$ and $H_2O_2$; and
a brush cleaning step utilizing a second cleaning solution comprising dilute hydrofluoric acid.

13. The poly opening polish process as claimed in claim 1, wherein the exposed gate forms a hydrophilic surface after the second polishing process.

14. The poly opening polish process as claimed in claim 1, further comprising applying a second polishing process to the gate, the second polishing process utilizing a wetting solution comprising a water soluble polymer surfactant, an alkaline compound and water.

15. The poly opening polish process as claimed in claim 14, wherein the water soluble polymer surfactant is selected from a group consisting of hydroxy ethyl cellulose, hydroxy propyl celluslose, polyvinly alcohol, polyvinyl pyrrolidone, and pullulan, and the alkaline compound is either ammonia or quaternary ammonium base.

16. The poly opening polish process as claimed in claim 14, wherein a concentration of the water soluble polymer surfactant is less than 1 wt %.

* * * * *